US009859889B2

United States Patent
Lee et al.

(10) Patent No.: US 9,859,889 B2
(45) Date of Patent: Jan. 2, 2018

(54) ULTRA LOW VOLTAGE DIGITAL CIRCUIT AND OPERATION METHOD THEREOF

(71) Applicant: Electronics and Telecommunications Research Institute, Daejeon (KR)

(72) Inventors: Woojoo Lee, Daejeon (KR); Young-Su Kwon, Daejeon (KR); Kyung Jin Byun, Daejeon (KR); Jin Ho Han, Seoul (KR); Nak Woong Eum, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/414,236

(22) Filed: Jan. 24, 2017

(65) Prior Publication Data
US 2017/0222648 A1 Aug. 3, 2017

(30) Foreign Application Priority Data

Feb. 3, 2016 (KR) .................. 10-2016-0013608
Jul. 8, 2016 (KR) .................. 10-2016-0087064

(51) Int. Cl.
| | |
|---|---|
| H03K 19/00 | (2006.01) |
| G06F 3/02 | (2006.01) |
| H01L 27/11 | (2006.01) |
| H03K 19/0944 | (2006.01) |
| H03K 17/96 | (2006.01) |
| H01L 29/49 | (2006.01) |

(52) U.S. Cl.
CPC ....... *H03K 19/0013* (2013.01); *G06F 3/0202* (2013.01); *H01L 27/1104* (2013.01); *H01L 29/49* (2013.01); *H03K 17/9638* (2013.01); *H03K 19/0944* (2013.01)

(58) Field of Classification Search
None
See application file for complete search history.

(56) References Cited

U.S. PATENT DOCUMENTS 7,225,100 B2 * 5/2007 Gaskins .................. G06F 1/206
702/132
7,317,605 B2 * 1/2008 Donze .................... G06F 1/206
361/103

(Continued)

OTHER PUBLICATIONS

Ermao Cai et al., "TEI-Turbo: Temperature Effect Inversion-Aware Turbo Boost for FinFET-Based Multi-Core Systems", ICCAD, 978-1-4673-8389-9, pp. 500-507, Nov. 6, 2015.

(Continued)

*Primary Examiner* — Vibol Tan
(74) *Attorney, Agent, or Firm* — Rabin & Berdo, P.C.

(57) ABSTRACT

An Ultra Low Voltage (ULV) digital circuit includes a logic circuit comprising a plurality of logic gates and a plurality of buffered interconnects for connecting between the plurality of logic gates, a temperature sensor configured to detect a temperature of the logic circuit, and a voltage controller configured to control a driving voltage provided to the logic circuit in order to reduce a power consumption of the logic circuit based on the detected temperature. Each of the plurality of logic gates and buffered interconnects reduces a signal delay as a temperature increases.

14 Claims, 12 Drawing Sheets

(56) References Cited

U.S. PATENT DOCUMENTS

| | | | | |
|---|---|---|---|---|
| 7,457,718 B2* | 11/2008 | Gaskins | ............... | G06F 1/206 |
| | | | | 702/132 |
| 8,238,185 B2* | 8/2012 | Lee | ............... | G11C 5/143 |
| | | | | 365/189.09 |
| 8,531,225 B1* | 9/2013 | Hussain | ............... | H03K 5/133 |
| | | | | 327/276 |
| 8,766,704 B2* | 7/2014 | Takayanagi | ............... | G06F 1/206 |
| | | | | 327/513 |
| 8,773,194 B2* | 7/2014 | Yao | ............... | H02M 3/02 |
| | | | | 327/513 |
| 9,047,927 B2* | 6/2015 | Takai | ............... | G11C 7/04 |
| 9,384,819 B2* | 7/2016 | Takai | ............... | G11C 7/04 |
| 2013/0156147 A1 | 6/2013 | Dadia | | |
| 2014/0089881 A1 | 3/2014 | Tetelbaum | | |
| 2015/0236169 A1 | 8/2015 | Park et al. | | |

OTHER PUBLICATIONS

Woojoo Lee et al., "Dynamic Thermal Management for FinFET-Based Circuits Exploiting the Temperature Effect Inversion Phenomenon", ISLPED, 10.1145/2627369.2627608, pp. 105-110, Aug. 13, 2015.

* cited by examiner

ULTRA LOW VOLTAGE DIGITAL CIRCUIT AND OPERATION METHOD THEREOF

CROSS-REFERENCE TO RELATED APPLICATIONS

This U.S. non-provisional patent application claims priority under 35 U.S.C. §119 of Korean Patent Application Nos. 10-2016-0013608, filed on Feb. 3, 2016, and 10-2016-0087064, filed on Jul. 8, 2016, the entire contents of which are hereby incorporated by reference.

BACKGROUND

The present disclosure relates to a digital circuit, and more particularly, to an ultra low voltage digital circuit and an operation method thereof.

In relation to a conventional digital circuit, a high-performance circuit design technique for maximizing the performance is mainly developed. However, as small digital devices such as mobile devices are used recently, a low-power circuit design technique for reducing power consumption is mainly developed.

In general, a high-performance circuit design technique has its object to maximize the operating speed or operating performance of a digital circuit without considering power consumption. On the other hands, a low-power circuit design technique has its object to minimize power consumption by lowering driving voltage or driving frequency such as Dynamic Voltage and Frequency Scaling (DVFS) or by using clock gating or power gating such as Dynamic Power Management (DPM). The low-power circuit design technique minimizes power consumption but has the disadvantage that operating performance is decreased and the high-performance circuit design technique maximizes operating performance but has the disadvantage that power consumption is increased. Recently, various techniques for simultaneously reducing power consumption and maintaining operating performance are developed.

SUMMARY

The present disclosure provides an ultra low voltage digital circuit for reducing power consumption and maintaining operating performance by lowing driving voltage as a temperature increases, through a Temperature-Effect-Inversion (TEI) phenomenon, and an operation method thereof.

An embodiment of the inventive concept provides an operation method of an Ultra Low Voltage (ULV) digital circuit including a logic circuit and a voltage controller for controlling a driving voltage provided to the logic circuit. The method includes: detecting a temperature of the logic circuit; and controlling the driving voltage to reduce a power consumption of the logic circuit based on the detected temperature, wherein the logic circuit reduces a signal delay as a temperature increases and maintains the signal delay of the logic circuit by the controlled driving voltage to be less than a reference value.

In an embodiment, the controlling of the driving voltage may include lowering the driving voltage, when the detected temperature is higher than the reference temperature and raising the driving voltage, when the detected temperature is lower than the reference voltage.

The method may further include: comparing the reduced power consumption to a temperature control power based on the detected temperature; and controlling a temperature of the logic circuit according to the comparison result, wherein the temperature control power indicates a power consumption reduced by controlling the temperature of the logic circuit In an embodiment, the logic circuit may include a plurality of logic gates and a plurality of buffered interconnects for connecting the plurality of logic gates and each of the buffered interconnects includes at least one buffer, wherein the controlling of the driving voltage may include selectively controlling the driving voltage or a buffer voltage provided to the at least one buffer, based on the detected temperature.

In an embodiment, the buffered interconnects may reduce a signal delay as a temperature increases.

In an embodiment of the inventive concept, an Ultra Low Voltage (ULV) digital circuit includes: a logic circuit including a plurality of logic gates and a plurality of buffered interconnects for connecting between the plurality of logic gates; a temperature sensor configured to detect a temperature of the logic circuit; and a voltage controller configured to control a driving voltage provided to the logic circuit in order to reduce a power consumption of the logic circuit based on the detected temperature, each of the plurality of logic gates and buffered interconnects reduces a signal delay as a temperature increases and a signal delay of the logic circuit by the controller driving voltage is maintained less than a reference signal delay.

In an embodiment, each of the plurality of logic gates may include at least one of a FinFET transistor, a CMOS transistor, a MOSFET transistor, and a multi gate transistor.

In an embodiment, each of the buffered interconnects may include at least one buffer and the at least one buffer may have a characteristic of reducing a signal delay as a temperature increases.

In an embodiment, the voltage controller may provide a buffer voltage to the at least one buffer and control each of the driving voltage and the buffer voltage independently based on the detected temperature.

In an embodiment, the reference signal delay may be a signal delay of the logic circuit at the lowest operating temperature in an operating temperature range of the logic circuit and the highest driving voltage in a driving voltage range of the logic circuit.

In an embodiment, the driving voltage may be in an ULV level of less than 1 V.

In an embodiment, when the detected temperature is included in a first temperature range, the voltage controller may adjust the driving voltage to a first voltage and when the detected temperature is in a second temperature range higher than the first temperature range, adjust the driving voltage to a second voltage lower than the first voltage.

In an embodiment, each of the first temperature range and the second temperature range may be classified based on a relationship of a temperature increment to signal delay of each of the plurality of logic gates and buffered interconnects.

In an embodiment, the ULV digital circuit may further include: a temperature control device configured to adjust a temperature of the logic circuit; and a power manager configured to control the temperature control device and the voltage controller based on the detected temperature.

In an embodiment, the power manager may selectively control the temperature control device or the voltage controller in order to reduce the power consumption based on the detected temperature.

In an embodiment, the logic circuit, the temperature sensor, and the voltage controller may be integrated on one semiconductor chip.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
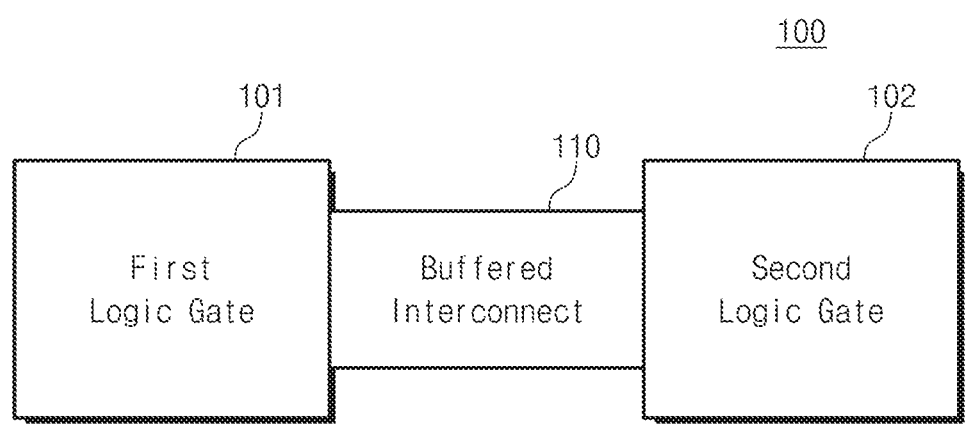
FIG. 1 is a block diagram illustrating a logic circuit according to an embodiment of the present invention.

Hereinafter, embodiments of the inventive concept will be described in more detail with reference to the accompanying drawings. In the description below, details such as detailed configurations and structures are simply provided to help overall understanding. Therefore, without departing from the technical idea and scope of the inventive concept, modifications on embodiments described in this specification may be performed by those skilled in the art. Furthermore, description of well-known functions and structures are omitted for clarity and conciseness. The terms used herein are defined in consideration of functions of the inventive concept and are not limited to specific functions. The definition of terms may be determined based on the details in description.

Modules in drawings or detailed description below may be shown in the drawings or may be connected to another component other than components described in detailed description. Each of connections between modules or components may be direct or indirect. Each of connections between modules or components may be a connection by communication or a physical access.

Components described with reference to terms such as parts, units, modules, and layers used in detailed description may be implemented in software, hardware, or a combination thereof. In example embodiments, software may be machine code, firmware, embedded code, and application software. For example, hardware may include an electrical circuit, an electronic circuit, a processor, a computer, an integrated circuit, integrated circuit cores, a pressure sensor, an inertial sensor, microelectromechanical systems (MEMS), a passive device, or a combination thereof.

Unless otherwise defined, all terms including technical or scientific meanings used in the specification have meanings understood by those skilled in the art. In general, the terms defined in the dictionary are interpreted to have the same meanings as contextual meanings and unless they are clearly defined in the specification, are not to be interpreted to have ideal or excessively formal meanings.

FIG. 1 is a block diagram illustrating a logic circuit according to an embodiment of the present invention. Referring to FIG. 1, a logic circuit 100 includes a first logic gate 101, a second logic gate 102, and a buffered interconnect 110. In example embodiments, for convenience of description and conciseness of drawing, two logic gates are shown, but the scope of the inventive concept is not limited thereto. The logic circuit 100 may further include a plurality of logic gates. The plurality of logic gates may be connected to each other through different buffered interconnects. In example embodiments, the logic circuit 100 may be one of various logic circuits or digital circuits for processing digital signals such as a CPU, a processor, a control device of an electronic system, and so on.

The first and second logic gates 101 and 102 may be logic devices implemented with semiconductor transistors such as FinFET transistors, CMOS transistors, MOSFET transistors, multi-gate transistors, and so on. Each of the first and second logic gates 101 and 102 may be a logic device for performing a predetermined logic operation. For example, each of the first and second logic gates 101 and 102 may be a logic device for performing a logic operation on an input signal to output an output signal, for example, AND, OR, XOR, NAND, NOT, Flip Flop, and so on, or a combination of the logic devices.

The first and second logic gates 101 and 102 may be connected to each other through the buffered interconnect 110. The buffered interconnect 110 may be a wire or an interconnect including at least one buffer. Each of the first and second logic gates 101 and 102 may transmit and receive signals through the buffered interconnect 110.

In example embodiments, the first and second logic gates 101 and 102 of the logic circuit 100 may operate in an Ultra-Low-Voltage (ULV) range. In example embodiments, the ULV indicates a driving voltage of less than about 1 V. The first and second logic gates 101 and 102 may have Temperature-Effect-Inversion (TEI) characteristics in an ULV level.

The TEI characteristic indicates a characteristic of reducing a delay time of a logic gate as a temperature increases. For example, a general digital circuit (for example, a semiconductor circuit or an electronic circuit) has a physical characteristic for increasing a delay time as a temperature increases. That is, in relation to a general digital circuit, as a temperature increase, the operating speed of a circuit is reduced. However, on the contrary to a general digital circuit, the first and second logic gates 101 and 102 according to the inventive concept reduce a delay time as a temperature increases in an ULV level. This characteristic is called TEI effect. A TEI characteristic or a TEI phenomenon is disclosed in "Dynamic thermal management for FinFET-based circuits exploiting the temperature effect inversion phenomenon" by Woojoo Lee et al., Proceedings of the 2014 international symposium, which is listed in 2014 conference materials and is hereby incorporated by reference.

In example embodiments, the buffered interconnect 110 may have a TEI characteristic. For example, in general, a simple wire (that is, a wire without a buffer) connected between logic gates has a delay time that is increased as a temperature increases. However, the buffered interconnect 110 according to the inventive concept may include at least one buffer and at least one buffer may have the above-mentioned TEI characteristic. That is, due to the TEI characteristic of a buffer included in the buffered interconnect 110, a delay time of the buffered interconnect 110 may be reduced as a temperature increases or may not be changed sensitively depending on a temperature change.

As mentioned above, the logic circuit 100 has a TEI characteristic for reducing a signal delay time as a temperature increases. Accordingly, unlike a conventional low-power design technique, as a temperature increases, the power consumption of the logic circuit 100 is reduced and the performance of the logic circuit 100 is maintained with more than a reference performance level at the same time.

Figure 2A:
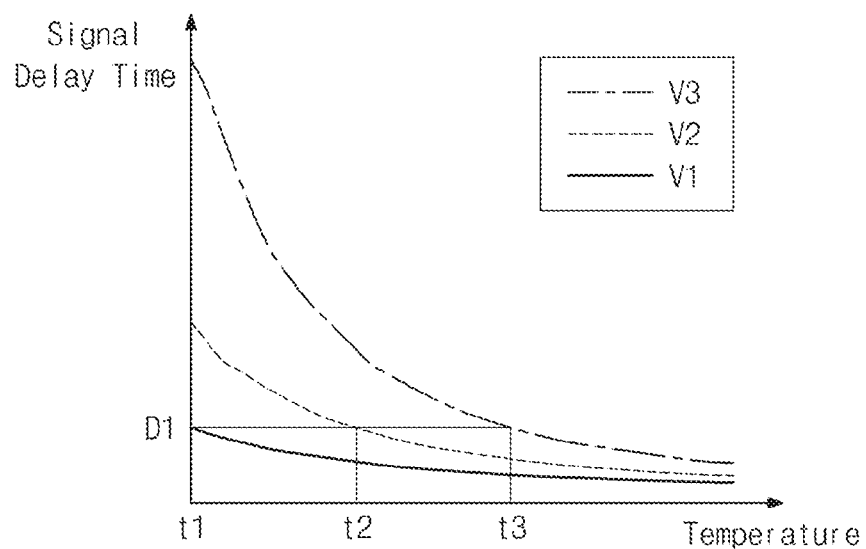
FIGS. 2A and 2B are graphs illustrating the TEI characteristics of logic gates of FIG. 1.
Figure 2B:
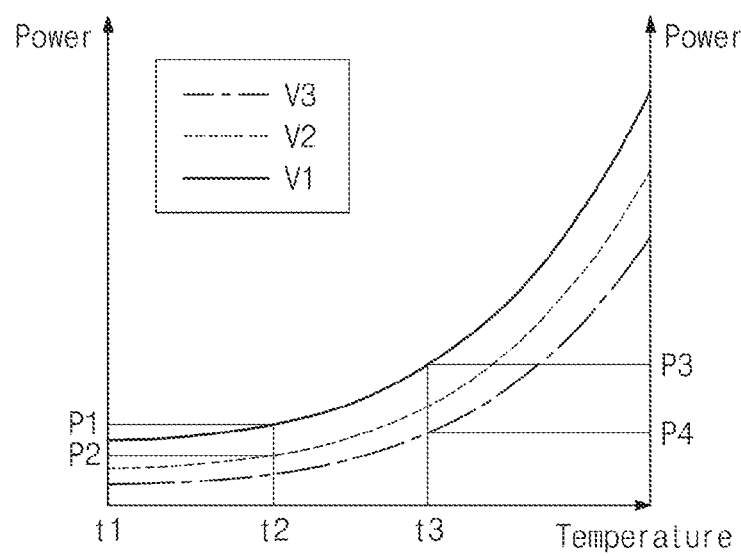

FIGS. 2A and 2B are graphs illustrating the TEI characteristics of logic gates of FIG. 1. In example embodiments, an X-axis of FIG. 2A indicates a temperature and a Y-axis indicates a signal delay time. An X-axis of FIG. 2B indicates a temperature and a Y-axis indicates power consumption.

Referring to FIGS. 1, 2A and 2B, when the first logic gate 101 operates with a first voltage V1 at a first temperature t1, a delay time of the first logic gate 101 may be a first delay time D1.

As shown in FIG. 2A, when a temperature of the first logic gate 101 rises to a second temperature t2, it may lower a driving voltage of the first logic gate 101 to a second voltage V2 being lower than the first voltage V1. In the case that the first logic gate 101 operates at the second temperature t2, even though a driving voltage is lowered to the second voltage V2, a delay time of the first logic gate 101 may be maintained as the first delay time D1. That is, in the case that a temperature rises from the first temperature t1 to the second temperature t2, even though driving voltage is lowered from the first voltage V1 to the second voltage V2, the performance of the first logic gate 101 may be maintained constantly.

Additionally, as shown in FIG. 2B, when operating with the first voltage V1 at the second temperature t2, the power consumption of the first logic gate 101 may be a first power P1. On the other hand, when operating with the second voltage V2 at the second temperature t2, the power consumption of the first logic gate 101 may be a second power P2.

As a result, when driving voltage changes from the first voltage V1 to the second voltage V2 at the second temperature t2, the power consumption of the first logic gate 101 may be reduced by P1-P2.

When a temperature of the first logic gate 101 is increased to the third temperature t3, the driving voltage of the first logic gate 101 may be lowered to the third voltage V3. In this case, similar to the above description, a delay time of the first logic gate 101 may be maintained constantly as the first delay time D1. Additionally, as shown in FIG. 2B, the power consumption of the first logic gate 101 may be reduced by P3-P4.

As described with reference to FIGS. 2A and 2B, by lowering driving voltage as a temperature of a logic gate increases, the performance of the logic gate is maintained constantly and power consumption may be reduced.

Figure 3:
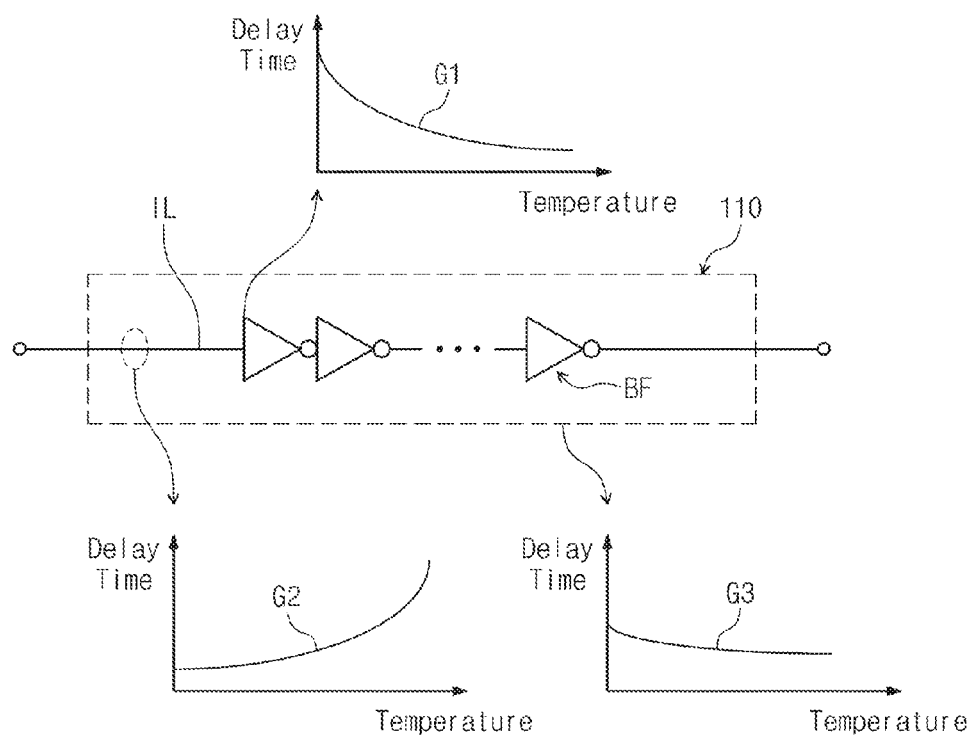
FIG. 3 is a view illustrating a buffered interconnect of FIG. 1.

FIG. 3 is a view illustrating a buffered interconnect of FIG. 1. For concise description, a structure in which a plurality of buffers are inserted into one wire is described. However, the scope of the inventive concept is not limited thereto, and the first and second logic gates 101 and 102 may be connected to each other through a plurality of wires where a plurality of buffers are inserted.

Referring to FIGS. 1 and 3, the buffered interconnect 110 may include a plurality of buffers BF. For example, as described with reference to FIG. 1, each of buffers BF may have TEI characteristics. For example, as shown in a first graph G1 of FIG. 3, each of the plurality of buffers BF may have a TEI characteristic for reducing a delay time as a temperature increases. In example embodiments, each of the plurality of buffers BF may be implemented with semiconductor transistor devices similar to the first and second logic gates 101 and 102.

On the other hand, an interconnect line IL may be implemented with a conductive material or a metallic material. Unlike the plurality of buffers BF, the interconnect line IL may have a temperature adaptation characteristic for increasing a delay time as a temperature increases. For example, as shown in a second graph G2 of FIG. 3, the interconnect line IL may have a characteristic for increasing a delay time as a temperature increases.

However, due to the TEI characteristics of the plurality of buffers BF, the temperature adaptation characteristic of the interconnect line IL may be cancelled out. For example, as shown in a third graph G3 of FIG. 3, the buffered interconnect 110 including the interconnect line IL and the plurality of buffers BF may have a TEI characteristic for reducing a delay time as a temperature increases. Although not shown in the drawing, the delay time of the buffered interconnect 110 may be designed not to be affected from the influence of a temperature change.

As described with reference to FIGS. 2A, 2B and 3, components included in the logic circuit 100 have a TEI characteristic for reducing a delay time as a temperature increases. Accordingly, as a temperature of the logic circuit 100 increases, by lowering driving voltage, power consumption may be reduced and the operating performance of the logic circuit 100 may be maintained constantly.

Figure 4:
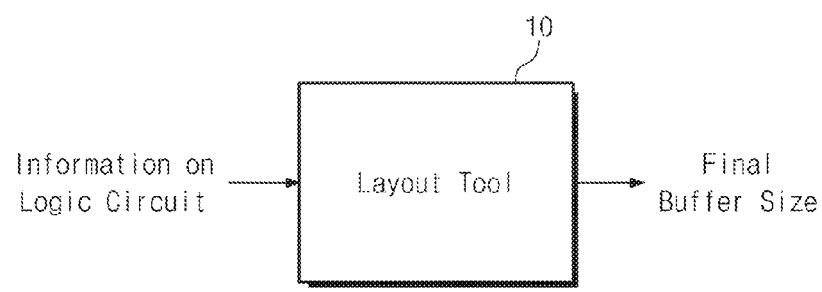
FIGS. 4 and 5 are views illustrating a method of inserting a buffer into a buffered interconnect of FIG. 1.
Figure 5:
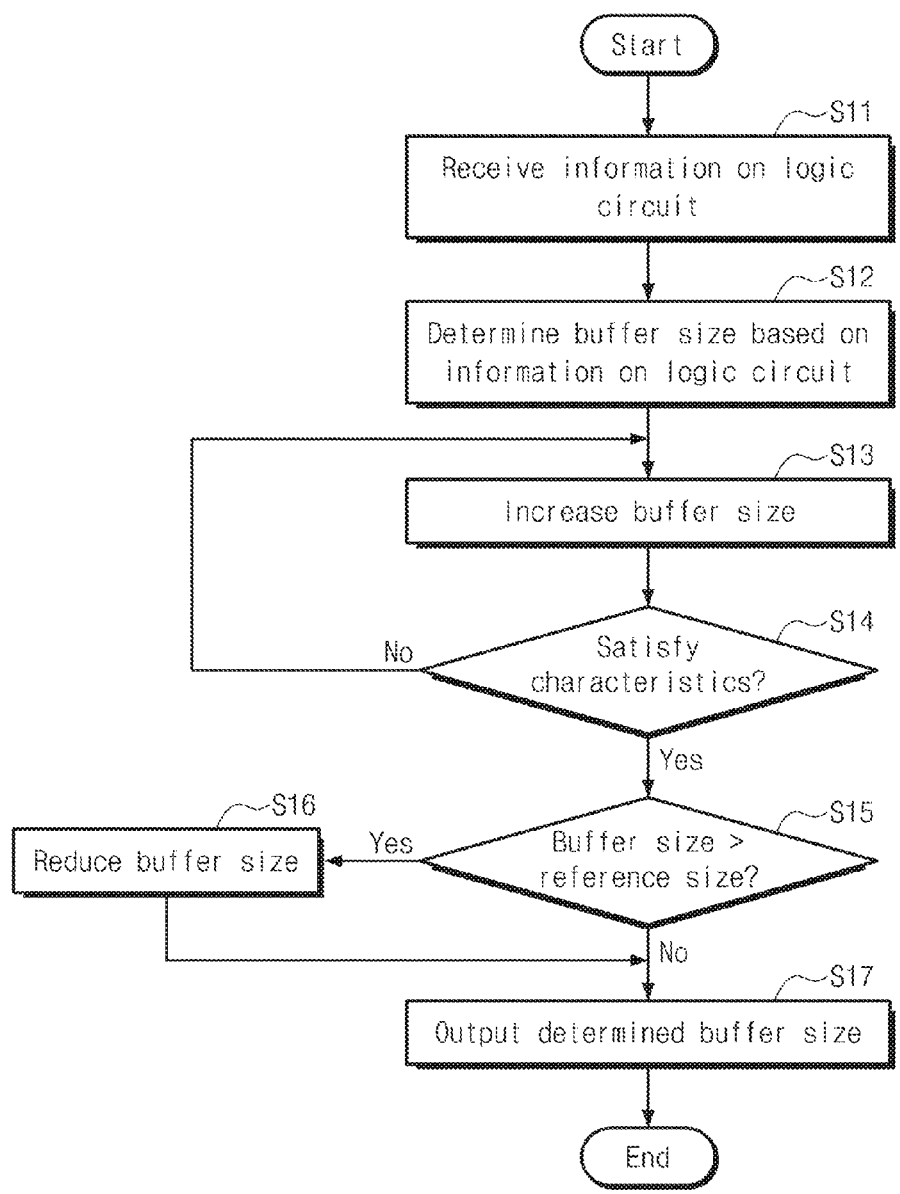

FIGS. 4 and 5 are views illustrating a method of inserting a buffer into a buffered interconnect of FIG. 1. Referring to FIGS. 3 to 5, a layout tool 10 may determine the sizes of the plurality of buffers BF included in the buffered interconnect 110 of the logic circuit 100. In example embodiments, the layout tool 10 may be provided in a software or hardware form. The layout tool 10 in software form may be stored in a computer-readable storage medium and may be implemented by an additional computing system.

In example embodiments, a conventional buffer insertion scheme provides a method for reducing a delay in an interconnect of a semiconductor circuit without considering a temperature condition. However, a buffer inserting method according to the inventive concept provides a buffer inserting method for controlling the temperature-delay characteristic of an interconnect For example, in a step S11, the layout tool 10 may receive information on the logic circuit 100 from an external device. The information on the logic circuit 100 may include information on a driving voltage range of a logic circuit 100, an operating temperature range of a logic circuit 100, a delay characteristic of an interconnect line, a temperature-delay characteristic of an interconnect line, and a temperature-delay characteristic of a buffer to be inserted.

In a step S12, the layout tool 10 may determine the initial buffer size based on information of a logic circuit 100. For example, the layout tool 10 may determine a buffer size in which a delay of the buffered interconnect 110 is minimized at a minimum operating temperature and a minimum driving voltage.

In a step S13, the layout tool 10 may increase the buffer size. For example, the layout tool 10 may increase a buffer size by a predetermined unit.

In a step S14, the layout tool 10 may determine whether the increased buffer size satisfies a required characteristic. In example embodiments, the required characteristic may indicate that the buffered interconnect 110 including buffers based on an increased buffer size has a TEI characteristic. When the required characteristic is not satisfied, the layout tool 10 may perform the step S13 again.

When the required characteristic is satisfied, in a step S15, the layout tool 10 may determine whether the buffer size is greater than a reference size. For example, the reference size may indicate a size that satisfies a design range of the logic circuit 100.

When the buffer size is greater than the reference size, in a step S16, the layout tool 10 reduces the buffer size. Then, the layout tool 10 performs a step S17.

When the buffer size is not greater than the reference size, in a step S17, the layout tool 10 outputs the determined buffer size. In example embodiments, the layout tool 10 may output information on the determined buffer size and the number of buffers per unit length of the buffered interconnect 110. Based on the outputted information, the logic circuit 100 may be designed by an external device.

As mentioned above, the buffered interconnect 110 may be implemented through a buffer inserting method. At this point, unlike a conventional buffer inserting method, a buffer inserting method according to the inventive concept may be performed in consideration of a temperature condition.

Figure 6:
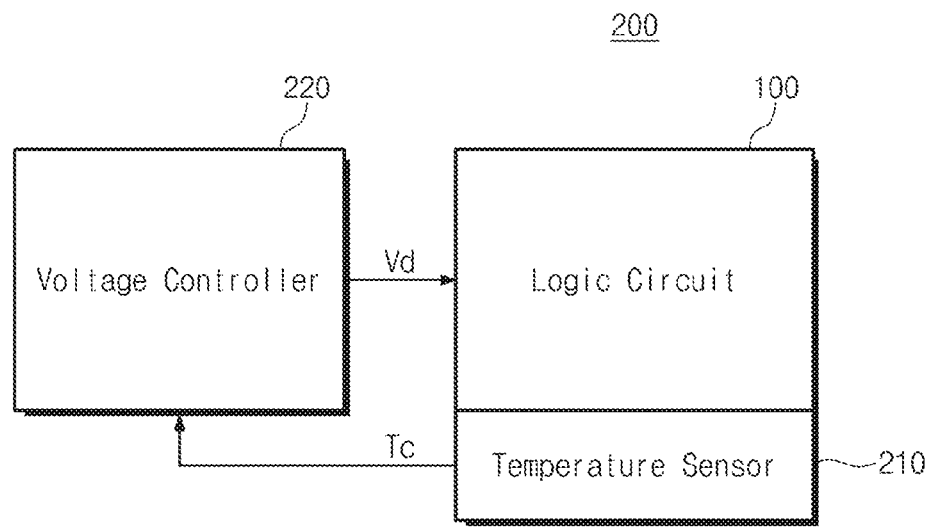
FIG. 6 is a block diagram illustrating a semiconductor device where a logic circuit of FIG. 1 is applied.

FIG. 6 is a block diagram illustrating a semiconductor device where a logic circuit of FIG. 1 is applied. For concise description, components unnecessary for describing the key features of the inventive concept are omitted.

Referring to FIG. 6, a semiconductor device 200 includes a logic circuit 100, a temperature sensor 210, and a voltage controller 220. The logic circuit 100 may be the logic circuit 100 described with reference to FIGS. 1 to 3. That is, the logic circuit 100 may include logic gates and buffered interconnects, and each component of the logic circuit 100 may have a TEI characteristic. In example embodiments, the semiconductor device 200 may be an ultra low voltage (ULV) digital circuit. In example embodiments, an ULV digital circuit may be a digital circuit or an electronic circuit driven at ULV. In example embodiments, compared to a conventional ULV digital circuit, an ULV digital circuit according to the inventive concept may have reduced power consumption and maintain a performance of more than a reference.

The temperature sensor 210 may detect a temperature Tc of the logic circuit 100. The temperature sensor 210 may provide the detected temperature T cot the voltage controller 220.

The voltage controller 220 may provide a driving voltage Vd used in the logic circuit 100. The voltage controller 220 may control the driving voltage Vd based on the temperature Tc of the logic circuit 100. For example, when the temperature Tc of the logic circuit 100 reaches a specific temperature range, the voltage controller 220 may lower the driving voltage Vd to a predetermined value. Alternatively, when the temperature Tc of the logic circuit 100 is not included within a specific temperature range, the voltage controller 220 may lower the driving voltage Vd to a target voltage corresponding to a temperature range where the temperature Tc is included. In example embodiments, a driving voltage to be controlled and temperature ranges may be determined based on a TEI characteristic of the logic gates and a TEI characteristic of the buffered interconnect 110, which are descried with reference to FIGS. 1 to 3.

Hereinafter, for concise description, the embodiment that the driving voltage Vd is adjusted depending on whether the temperature Tc of the logic circuit 100 is included in a specific temperature range will be described in more detail. However, the scope of the inventive concept is not limited thereto, and as the temperature Tc be changed, the driving voltage Vd may be changed linearly or proportionally based on the TEI characteristics of logic gates and buffered interconnects.

Figure 7:
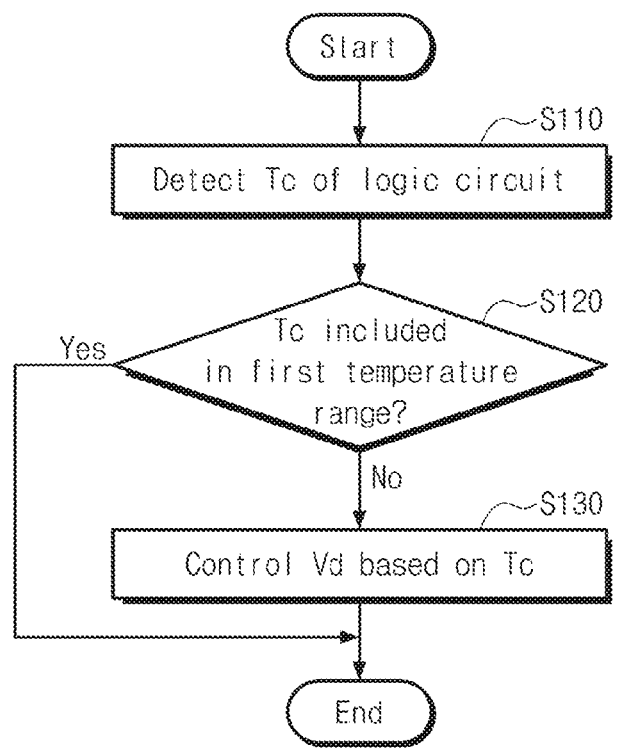
FIG. 7 is a flowchart illustrating an operation of a voltage controller of FIG. 6.

FIG. 7 is a flowchart illustrating an operation of a voltage controller of FIG. 6. Referring to FIGS. 6 and 7, in a step S110, the voltage controller 220 may detect the temperature Tc of the logic circuit 100. For example, the temperature sensor 210 may detect the temperature Tc of the logic circuit 100 and the voltage controller 220 may receive the detected temperature Tc (or information on temperature) from the temperature sensor 210.

In a step S120, the voltage controller 220 may determine whether the detected temperature Tc is included in a first temperature range. For example, the first temperature range may be a predetermined temperature range based on the TEI characteristics of logic gates and buffered interconnects in the logic circuit 100. In example embodiments, the first temperature range may indicate a temperature range corresponding to the current driving voltage Vd.

When the detected temperature Tc is included in the first temperature range, the voltage controller 220 may not control the driving voltage Vd.

When the detected temperature Tc is not included in the first temperature range, the voltage controller 220 may control the driving voltage Vd based on the temperature Tc. For example, when the detected temperature Tc is included in a second temperature range higher than the first temperature range, the voltage controller 220 may lower the driving voltage Vd. In this case, even though the driving voltage Vd is lowered, an operating speed of the logic circuit 100 may be maintained by the TEI characteristic of the logic circuit 100. Alternatively, when the detected temperature Tc is included in a third temperature range lower than the first temperature range, the voltage controller 220 may raise the driving voltage Vd selectively.

Figure 8:
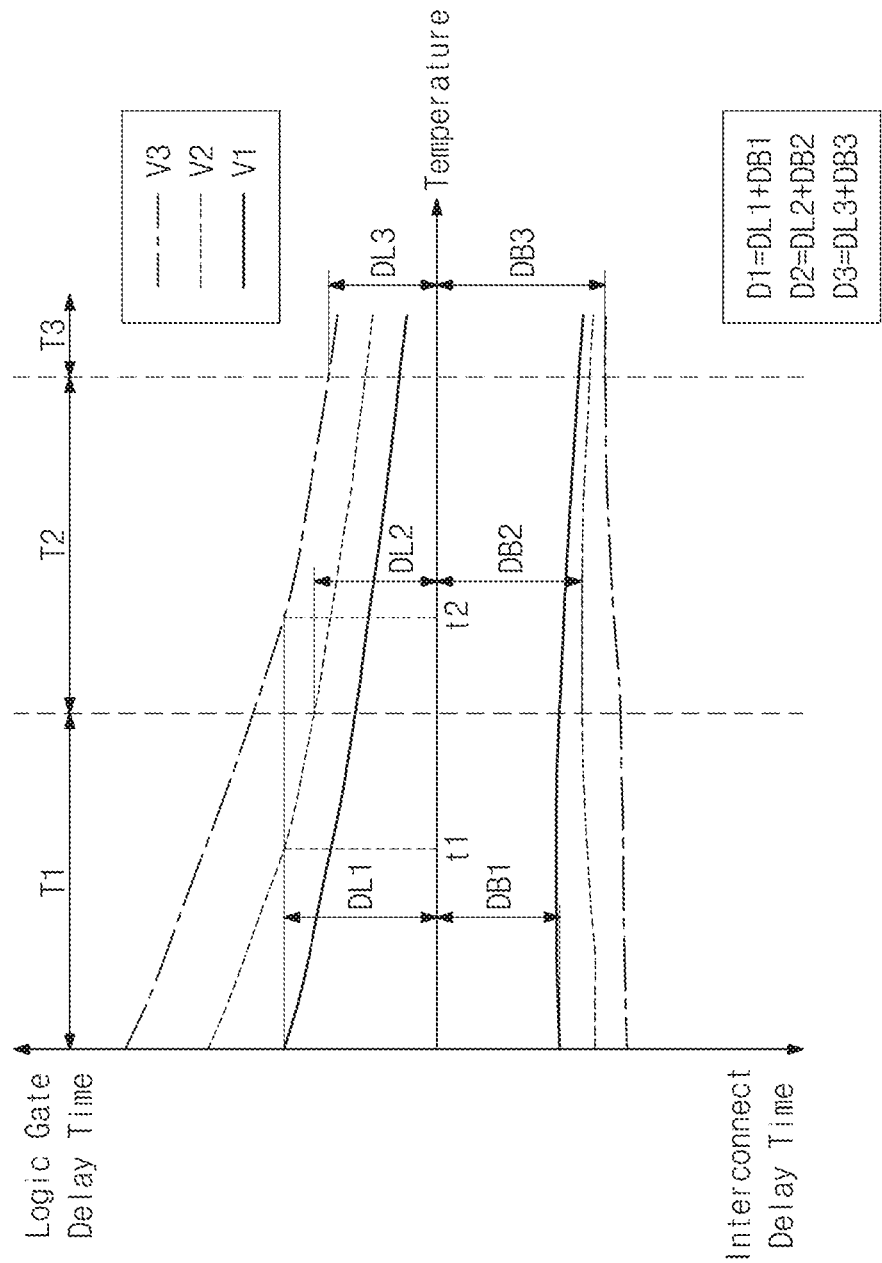
FIG. 8 is a graph illustrating the driving voltage reducing method of FIGS. 6 and 7.

FIG. 8 is a graph illustrating the driving voltage reducing method of FIGS. 6 and 7. In example embodiments, an X-axis of FIG. 8 indicates a temperature and a Y-axis indicates a delay time of a logic gate and a delay time of a buffered interconnect.

Referring to FIGS. 6 to 8, the semiconductor device 200 may be configured to operate at the first voltage V1 in the first temperature range T1. For example, a reference performance of the semiconductor device 200 may be configured based on the lowest temperature condition in an operating temperature range and the highest driving voltage in a driving voltage range. That is, a reference performance of the semiconductor device 200 may corresponds to a reference signal delay, and the reference signal delay may indicate a signal delay of the semiconductor device 200 based on the lowest temperature condition in an operating temperature range and the highest driving voltage in a driving voltage range.

In this case, a reference signal delay (that is, a reference performance) of the semiconductor device 200 may correspond to the first delay time D1. The first delay time D1 may include a first logic gate delay time DL1 and a first buffered interconnect delay time DB1.

That is, in the first temperature range T1, the voltage controller 220 of the semiconductor device 200 may provide a first voltage V1 to the logic circuit 100. At this point, under the conditions of the first temperature range T1 and the first voltage V1, the semiconductor device 200 may maintain a faster operating performance than the first delay time D1. That is, under the conditions of the first temperature range T1 and the first voltage V1, the semiconductor device 200 may satisfy at least a reference signal delay (or a reference performance).

Then, in the second temperature range T2, the semiconductor device 200 may operate at the second voltage V2. For example, when the temperature Tc of the logic circuit 100 is included in the second temperature range T2, the voltage controller 220 may lower the driving voltage Vd from the first voltage V1 to the second voltage V2. At this point, a delay time indicating an operating performance of the semiconductor device 100 may be a second delay time D2. The second delay time D2 may include a second logic gate delay time DL2 and a second buffered interconnect delay time DB2. In example embodiments, the second delay time D2 may be a delay time that satisfies the above-mentioned reference signal delay. That is, in the second temperature range T2, even though the driving voltage Vd is lowered to the second voltage V2, the performance of the semiconductor device 200 may be maintained less than at least a reference signal delay (that is, it is maintained more than a reference performance).

In the same manner, in the third temperature range T3, the semiconductor device 200 may operate at the third voltage V3. For example, when the temperature Tc of the logic circuit 100 is included in the third temperature range T3, the voltage controller 220 may lower the driving voltage Vd from the first voltage V1 to the third voltage V3 or from the second voltage V2 to the third voltage V3. At this point, a delay time indicating an operating performance of the semiconductor device 100 may be a third delay time D3. The third delay time D3 may include a third logic gate delay time DL3 and a third buffered interconnect delay time DB3. In example embodiments, the third delay time D3 may be a delay time that satisfies the above-mentioned reference signal delay. That is, in the third temperature range T3, even when the driving voltage Vd is lowered to the third voltage V3, the performance of the semiconductor device 200 may be maintained constantly.

In example embodiments, the first voltage V1 is higher than the second voltage V2, and the second voltage V2 is higher than the third voltage V3.

In example embodiments, if only a delay time of a logic gate is considered, the driving voltage Vd is reduced to the second voltage V2 at a first temperature t1, or the driving voltage Vd may be reduced to the third voltage V3 at a second temperature t2. In this case, although a delay time of a logic gate is maintained constantly, a delay time of a buffered interconnect may be increased. Due to this, an overall performance of the semiconductor device 200 may be deteriorated.

That is, as described above, according to the inventive concept, temperature ranges may be set based on the TEI characteristic of a buffered interconnect in addition to the TEI characteristic of a logic gate, and a driving voltage of the semiconductor device 200 may be controlled based on the set temperature ranges. Due to this, the performance of the semiconductor device 200 may be maintained and power consumption may be reduced at the same time.

Figure 9:
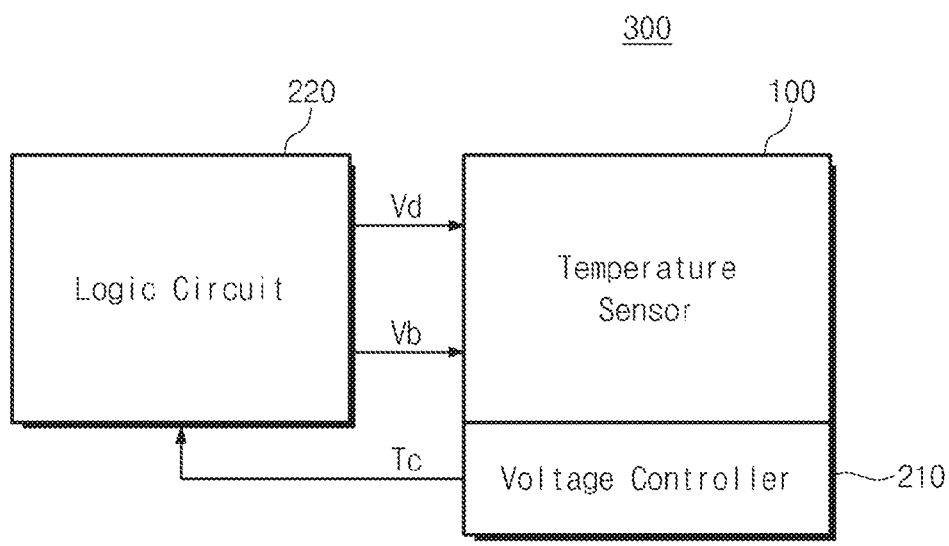
FIG. 9 is a block diagram illustrating a semiconductor device according to an embodiment of the inventive concept.

FIG. 9 is a block diagram illustrating a semiconductor device according to an embodiment of the inventive concept. Referring to FIG. 9, a semiconductor device 300 includes a logic circuit 100, a temperature sensor 310, and a voltage controller 320. For concise description, since the logic circuit 100, the temperature sensor 310, and the voltage controller 320 are described above, their detailed descriptions are omitted.

The voltage controller 320 of FIG. 9 may provide the driving voltage Vd provided to logic gates of the logic circuit 100 and provide the buffer voltage Vb provided to a buffered interconnect. For example, as described above, the logic circuit 100 may include logic gates and buffered interconnects, and each of them may have a TEI characteristic.

In example embodiments, the logic gates of the logic circuit 100 may operate based on the driving voltage Vd provided from the voltage controller 320, and a plurality of buffers BF included in the buffered interconnects may operate based on the buffer voltage Vb. That is, the logic gates and buffered interconnects of the semiconductor device 300 may operate based on different voltages.

The voltage controller 320 may control each of the driving voltage Vd and the buffer voltage Vb based on a temperature range including the temperature Tc of the logic circuit 100. For example, when the temperature Tc of the logic circuit 100 is included in the first temperature range, the voltage controller 320 may control the driving voltage Vd with a first voltage and control the buffer voltage Vb with the first voltage. When the temperature Tc of the logic circuit 100 is included in the second temperature range, the voltage controller 320 may control the driving voltage with a second voltage and maintain the buffer voltage Vb as the first voltage. Alternatively, when the temperature Tc of the logic circuit 100 is included in the third temperature range, the voltage controller 320 may control the driving voltage VD with a second voltage and control the buffer voltage Vb with the third voltage. In example embodiments, the semiconductor device 300 that operates based on a controlled driving voltage and a controller buffer voltage in each temperature range may satisfy at least a reference signal delay.

Figure 10:
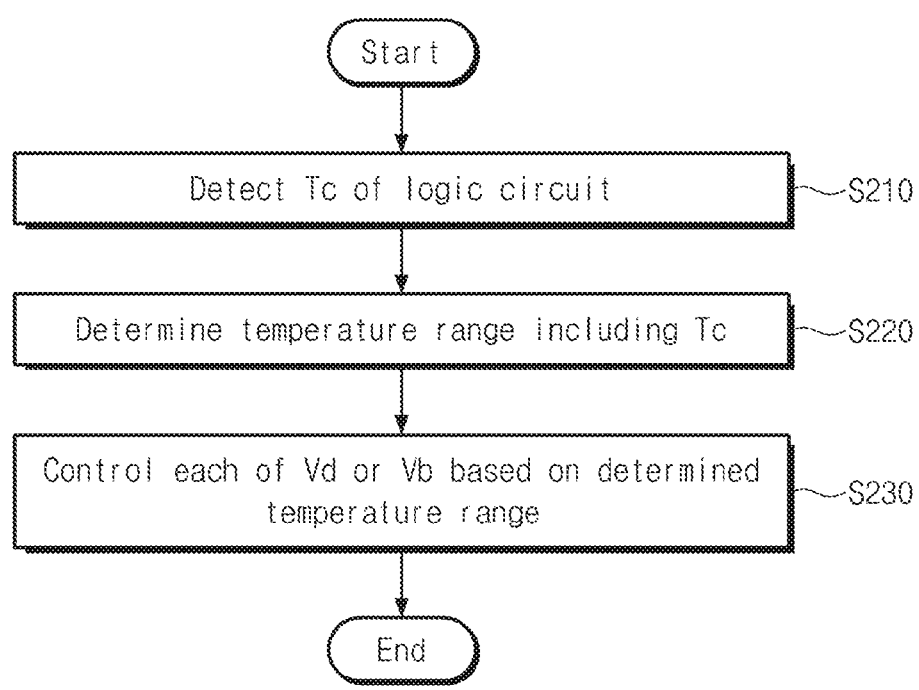
FIG. 10 is a flowchart illustrating an operation of a voltage controller of FIG. 9.
Figure 11:
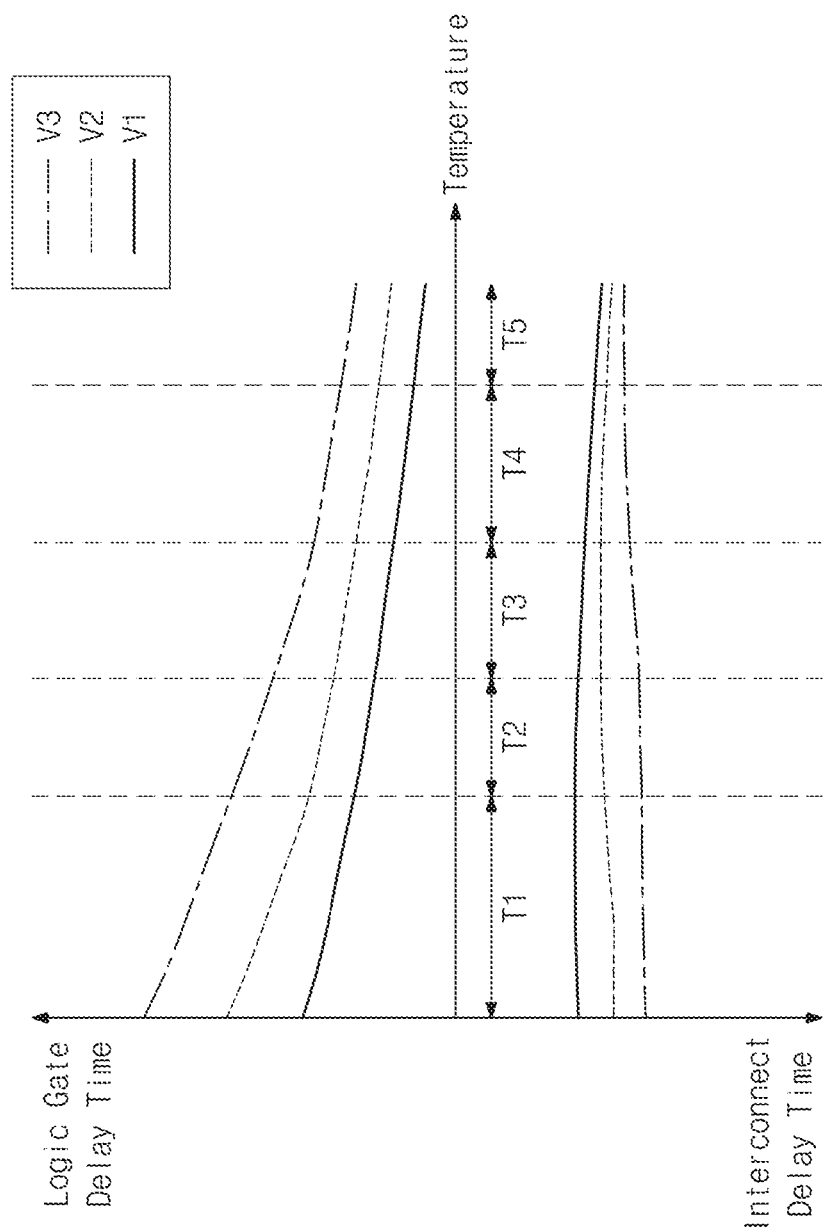
FIG. 11 is a graph illustrating operation S230 of FIG. 10 in detail.

FIG. 10 is a flowchart illustrating an operation of a voltage controller of FIG. 9. FIG. 11 is a graph illustrating operation S230 of FIG. 10 in detail. In example embodiments, an X-axis of FIG. 11 indicates a temperature and a Y-axis indicates a delay time of a logic gate and a delay time of a buffered interconnect.

Referring to FIGS. 9 and 11, in a step S210, the voltage controller 320 may detect the temperature Tc of the logic circuit 100. Since an operation of the step S210 is similar to an operation of the step S110 of FIG. 7, its detailed description is omitted.

In a step S220, the voltage controller 320 may determine a temperature range where the detected temperature Tc is included. For example, the voltage controller 320 may determine a temperature range where the detected temperature Tc is included among a plurality of temperature ranges.

In a step S230, the voltage controller 320 may control each of the driving voltage Vd or the buffer voltage Vb based on a determined temperature range. For example, as shown in FIG. 11, an operating temperature range of the semiconductor device 300 may be divided into first to fifth temperature ranges T1 to T5. As described with reference to FIG. 8, a reference signal delay of the semiconductor device 300 may correspond to the first delay time D1. That is, in each of the first to fifth temperature ranges T1 to T5, the driving voltage Vd and the buffer voltage Vb are controlled in order for the semiconductor device 300 to have at least a shorter delay time than the first delay time D1

For this, when the detected temperature Tc is included in the first temperature range T1, the voltage controller 320 may control the driving voltage Vd with a first voltage and control the buffer voltage Vb with the first voltage V1. When the detected temperature Tc is included in the second temperature range T2, the voltage controller 320 may control the driving voltage Vd with the second voltage V2 and control the buffer voltage Vb with the first voltage V1. When the detected temperature Tc is included in the third temperature range T3, the voltage controller 320 may control the driving voltage Vd with the second voltage V2 and control the buffer voltage Vb with the second voltage V2. In the same manner, when the detected temperature Tc is included in the fourth temperature range T4, the voltage controller 320 may control the driving voltage Vd with the second voltage V2 and control the buffer voltage Vb with the third voltage V3. When the detected temperature Tc is included in the fifth temperature range T5, the voltage controller 320 may control the driving voltage Vd with the third voltage V3 and control the buffer voltage Vb with the second voltage V2.

As mentioned above, as the driving voltage Vd and the buffer voltage Vb are controlled according to each temperature range, in each temperature range, a performance of the semiconductor device 300 may be maintained more than a reference performance.

In example embodiments, the above-mentioned driving voltage Vd and buffer voltage Vb are exemplary and the scope of the inventive concept is not limited thereto. Each of the driving voltage Vd and the buffer voltage Vb according to each temperature range may vary on the basis of the TEI characteristics of logic gates and buffered interconnects.

Figure 12:
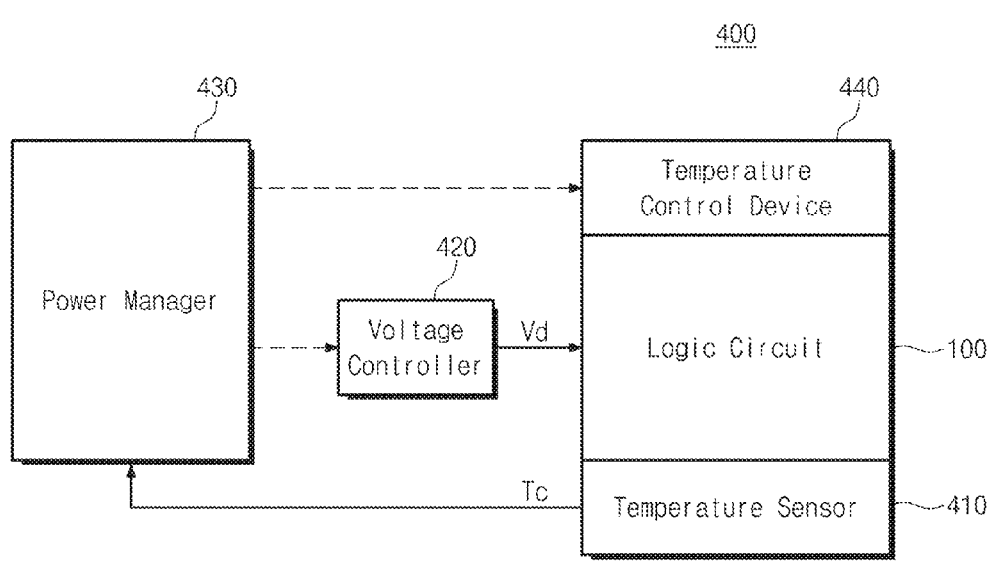
FIG. 12 is a block diagram illustrating a semiconductor device according to an embodiment of the inventive concept.

FIG. 12 is a block diagram illustrating a semiconductor device according to an embodiment of the inventive concept. Referring to FIG. 12, a semiconductor device 400 includes a logic circuit 100, a temperature sensor 410, a voltage controller 420, a power manager 430, and a temperature control device 440. Since the logic circuit 100, the temperature sensor 410, and the voltage controller 420 are described above, their detailed descriptions are omitted. In example embodiments, the logic circuit 100, the temperature sensor 410, the voltage controller 420, the power manager 430, and the temperature control device 440 may be integrated on one semiconductor chip, or each of them may be configured with a separate semiconductor chip, or they may be included in one semiconductor package.

The power manager 430 may control the voltage controller 420 or the temperature control device 400 based on the temperature Tc of the logic circuit 100. For example, as similar to the above-mentioned operating method, the power manager 430 may control the voltage controller 420 based on the temperature Tc of the logic circuit 100. Alternatively, the power manager 430 may control the temperature control device 400 based on the temperature Tc of the logic circuit 100.

The temperature control device 440 may control a temperature of the logic circuit 100. For example, the temperature control device 440 may be a cooling device. The temperature control device 440 may lower or raise the temperature Tc of the logic circuit 100 according to a control of the power manager 430.

In example embodiments, the power manager 430 may maintain the performance of the semiconductor device 400 to be less than a reference signal layer and reduce power consumption by controlling the driving voltage Vd provided to the logic circuit 100 through the voltage controller 420 or controlling the temperature Tc of the logic circuit 100 through the temperature control device 440. In example embodiments, an operation of the power manager 430 will be described in more detail with reference to FIG. 13.

Figure 13:
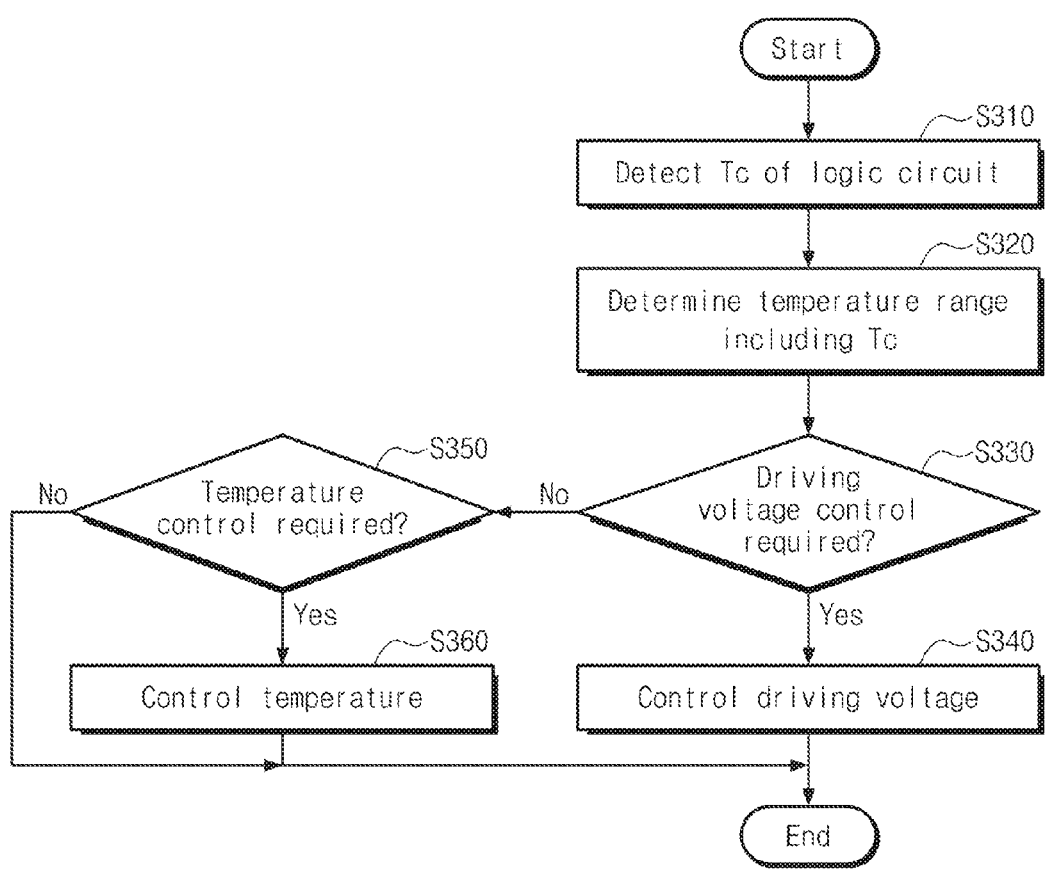
FIG. 13 is a flowchart illustrating an operation of a power manager of FIG. 12.

FIG. 13 is a flowchart illustrating an operation of a power manager of FIG. 12. Referring to FIGS. 12 and 13, in a step S310, the power manager 430 may detect the temperature Tc of the logic circuit 100. For example, the temperature sensor 410 may detect the temperature Tc of the logic circuit 100 and provide it to the power manager 430.

In a step S320, the power manager 430 may determine a temperature range where the detected temperature Tc is included. For example, as described with reference to FIG. 8 or 11, an operating temperature range of the logic circuit 100 or the semiconductor device 400 may be divided into a plurality of temperature ranges. The power manager 430 may determine a temperature range where the detected temperature Tc is included among a plurality of temperature ranges.

In a step S330, the power manager 430 may determine whether a driving voltage control is required. For example, as shown in FIG. 8, when the driving voltage Vd is the first voltage V1 and the detected temperature Tc is included in the first temperature range T1 (that is, a temperature range corresponding to the first voltage V1), an additional driving voltage control is not required. However, when the driving voltage Vd is the first voltage V1 and the detected temperature Tc is included in the second temperature range T2 (that is, a temperature range corresponding to the second voltage V2), the driving voltage Vd is required to be controlled by or changed to the second voltage V2. The power manager 430, as mentioned above, may determine whether a driving voltage control is required based on a voltage range that the detected temperature Tc belongs and the driving voltage that is currently in use.

When a control of the driving voltage Vd is required, in a step S340, the power manager 430 may control the driving voltage Vd.

When a control of the driving voltage Vd is not required, in a step S350, the power manager 430 may determine whether a temperature control is required. For example, as described with reference to FIGS. 2A and 2B, when the same driving voltage is used, as a temperature is lowered, power consumption may be reduced. That is, as the temperature Tc of the logic circuit 100 is lowered, power consumption used in the logic circuit 100 may be reduced and due to this, the overall power consumption of the semiconductor device 400 may be reduced.

In example embodiments, the power manager 430 may determine the power consumption that is reduced when a temperature of the logic circuit 100 is lowered to a specific temperature in the temperature range determined in operation S320 with the power consumption for cooling used in the temperature control device 440. When the reduced power consumption is greater than the power consumption for cooling, the power manager 430 may determine that a temperature control is required. In this case, in operation S360, the power manager 430 may perform a temperature control. For example, the power manager 430 may lower or raise a temperature of the logic circuit 100 by using the temperature control device 440.

Figure 14:
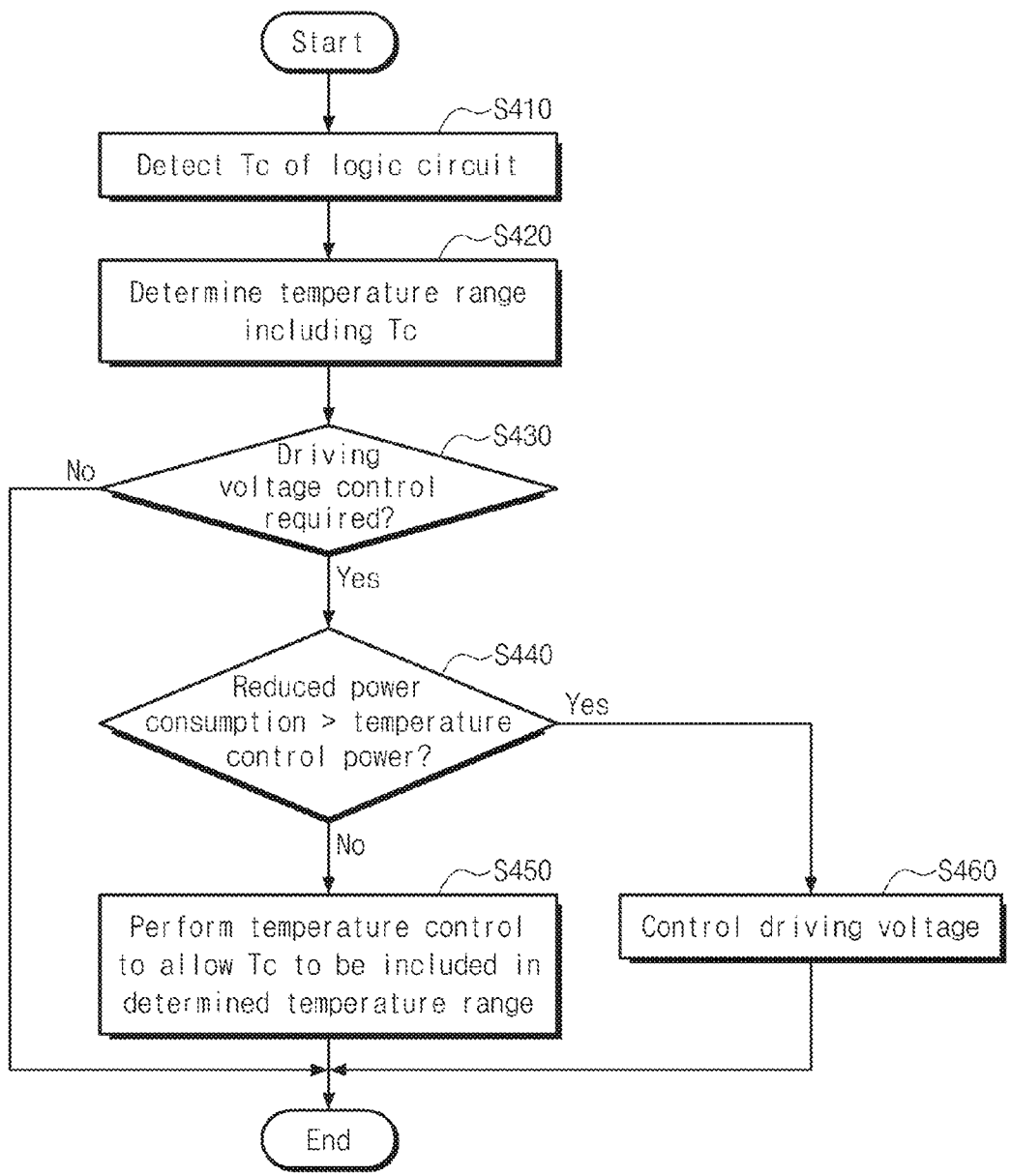
FIG. 14 is a flowchart illustrating another operation of a power manager of FIG. 12.

FIG. 14 is a flowchart illustrating another operation of a power manager of FIG. 12. Referring to FIGS. 12 and 14, the power manager 430 may perform operations of steps S410 to S430. Since the operations of steps S410 to S430 are similar to operations of the steps S310 to S320 of FIG. 13, their detailed descriptions are omitted.

When the determination result in the step S430 indicates that a driving voltage control is necessary, in a step S440, the power manager 430 may compare the power consumption reduced by a driving voltage control with a temperature control power consumed by a temperature control.

For example, as described with reference to FIGS. 2A and 2B, when the driving voltage Vd is lowered in the same temperature Tc, the power consumption in the logic circuit 100 is reduced. Additionally, when a temperature is lowered at the same driving voltage Vd, power consumption may be reduced. That is, the power manager 430 may control the temperature Tc or the driving voltage Vd of the logic circuit 100 in order to reduce the power consumption of the logic circuit 100 or the semiconductor device 400. At this point, in order to select a temperature control or a driving voltage control, the power manager 430 compares the power consumption reduced by controlling the driving voltage Vd with the temperature control power consumed by a temperature control.

When the reduced power consumption is not greater than the temperature control power, in a step S450, the power manager 430 may control the temperature Tc of the logic circuit 100 within the determined temperature range. When the reduced power consumption is greater than the temperature control power, in a step S460, the power manager 430 may control the driving voltage Vd.

As mentioned above, the power manager 430 of the semiconductor device 400 may reduce the overall power consumption of the semiconductor device 400 and the semiconductor device 400 may maintain a signal delay of less than a reference signal delay by controlling the driving voltage Vd according to the temperature Tc of the logic circuit 100 or controlling the temperature Tc. At this point, the power manager 430 may maximize a power consumption reduction effect by controlling the semiconductor device 400 through a control method for reducing power consumption among a driving voltage control method and a temperature control method.

Figure 15:
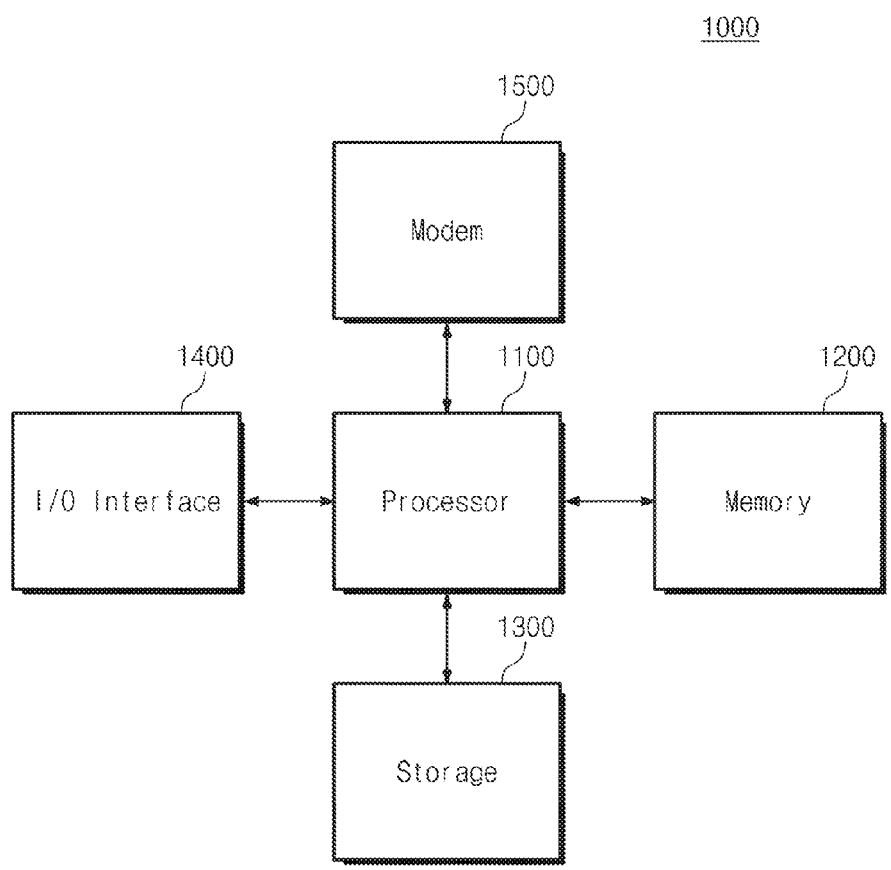
FIG. 15 is a block diagram In example embodiments, illustrating a user system where a semiconductor device is applied according to an embodiment of the inventive concept.

FIG. 15 is a block diagram illustrating a user system where a semiconductor device is applied according to an embodiment of the inventive concept. Referring to FIG. 15, a user system 1000 may include a processor 1100, a memory 1200, a storage 1300, an input/output interface 1400, and a modem 1500. In example embodiments, the user system 1000 may include at least one of a computer, portable computer, an Ultra Mobile PC (UMPC), a workstation, a net-book, a PDA, a portable computer, a web tablet, a wireless phone, a mobile phone, a smart phone, a digital camera, a digital audio recorder, a digital audio player, a digital picture recorder, digital picture player, a digital video recorder, a digital video player, a device for transmitting/receiving information in a wireless environment, and various computing systems configuring a home network. Alternatively, the user system 1000 may include components configuring Internet of Things (IoT) or a low power digital circuit.

In example embodiments, the user system 1000 is not limited to the components shown in FIG. 15. For example, the user system 1000 may only some of the shown components or may further include other components other than the components shown in FIG. 15.

The processor 1100 may drive components included in the user system 1000 or perform various arithmetic operations. In example embodiments, the processor 1100 may be provided as a low power digital circuit and may be the semiconductor device described with reference to FIGS. 1 to 14.

The memory 1200 may be used as a main memory, a buffer memory, or a cache memory of the processor 1100. The memory 1200 may be provided as a random access memory device such as Dynamic Random Access Memory (DRAM), Synchronous DRAM (SDRAM), Static RAM (SRAM), Double Date Rate SDRAM (DDR SDRAM), DDR2 SDRAM, DDR3 SDRAM, Phase-change RAM (PRAM), Magnetic RAM (MRAM), and Resistive RAM (RRAM). In example embodiments, the memory 1200 may include the semiconductor device described with reference to FIGS. 1 to 15, and a semiconductor device in the memory 1200 may control an operation of the memory 1200.

The storage 1300 may be a mass storage medium of the user system 1000. The storage 1300 may be provided as a mass storage semiconductor memory device such as Phase-change RAM (PRAM), Magnetic RAM (MRAM), Resistive RAM (RRAM), NAND flash, or NOR flash or a mass storage magnetic disk device such as Hard Disk Drive (HDD). In example embodiments, the storage 1300 may include the semiconductor device described with reference to FIGS. 1 to 14, and the semiconductor device may be used as a controller for controlling an operation of the storage 1300.

The input/output interface 1400 provides an interface for inputting or outputting data or instructions to the user system 1000. The input/output interface 1400 may be provided as input/output devices such as a camera, a touch screen, a motion recognition module, a microphone, a display, and a speaker.

The modem 1500 may perform communication with external devices. In example embodiments, the model 1500 may support wireless communications such as Code Division Multiple Access (CDMA), Global System for Mobile communication (GSM), wideband CDMA (WCDMA), CDMA-2000, Time Division Multiple Access (TDMA), Long Term Evolution (LTE), Wimax, WLAN, UWB, Bluetooth, and WI-DI.

In example embodiments, each component in the user system 1000 may be implemented with the semiconductor device described with reference to FIGS. 1 to 14 or may include a semiconductor device. A semiconductor device of each component may control an operation of the each component or perform various arithmetic operations according to a control of an external device.

According to the above-mentioned inventive concept, a semiconductor device includes a logic circuit, a voltage controller for providing a driving voltage of the logic circuit, and a temperature sensor for detecting a temperature of the logic circuit. The logic circuit includes a plurality of logic gates having a TEI characteristic and a buffered interconnect having a TEI characteristic for connecting between the plurality of logic gates. The voltage controller may reduce the power consumption of a semiconductor device by adjusting driving voltage according to a temperature of a logic circuit. With this, by the TEI characteristics of components in a logic circuit, the performance of a semiconductor device may be maintained more than a reference performance. Accordingly, a semiconductor device with reduced power consumption and improved performance may be provided.

According to the inventive concept, by lowering a driving voltage of a semiconductor device by using a TEI characteristic as a temperature increases, the performance of an ULV digital circuit may be maintained more than a reference performance. In addition, the power consumption of an ULV digital circuit may be reduced by a driving voltage control. Additionally, by lowering a driving voltage of a semiconductor device as a temperature increases, a speed at which a temperature of an ULV digital circuit is increased may be delayed. Accordingly, an ULV digital circuit having reduced power consumption and improved performance and an operation method thereof are provided.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. An operation method of an Ultra Low Voltage (ULV) digital circuit comprising a logic circuit and a voltage controller for controlling a driving voltage provided to the logic circuit, the method comprising:
   detecting a temperature of the logic circuit; and
   controlling the driving voltage to reduce a power consumption of the logic circuit based on the detected temperature,
   wherein the logic circuit reduces a signal delay as a temperature increases and maintains the signal delay of the logic circuit by the controlled driving voltage to be less than a reference value,
   wherein the logic circuit comprises a plurality of logic gates and a plurality of buffered interconnects for connecting the plurality of logic gates and each of the buffered interconnects comprises at least one buffer, and
   wherein the buffered interconnects reduce a signal delay as a temperature increases.

2. The method of claim 1, wherein the controlling of the driving voltage comprises lowering the driving voltage, when the detected temperature is higher than the reference temperature and raising the driving voltage, when the detected temperature is lower than the reference voltage.

3. The method of claim 1, further comprising:
   comparing the reduced power consumption to a temperature control power based on the detected temperature; and
   controlling a temperature of the logic circuit according to a result of the comparing,
   wherein the temperature control power indicates a power consumption reduced by controlling the temperature of the logic circuit.

4. The method of claim 1,
   wherein the controlling of the driving voltage comprises selectively controlling the driving voltage or a buffer voltage provided to the at least one buffer, based on the detected temperature.

5. An Ultra Low Voltage (ULV) digital circuit comprising:
   a logic circuit comprising a plurality of logic gates and a plurality of buffered interconnects for connecting between the plurality of logic gates;
   a temperature sensor configured to detect a temperature of the logic circuit; and
   a voltage controller configured to control a driving voltage provided to the logic circuit in order to reduce a power consumption of the logic circuit based on the detected temperature,
   wherein each of the plurality of logic gates and buffered interconnects reduces a signal delay as a temperature increases and a signal delay of the logic circuit by the controller driving voltage is maintained less than a reference signal delay, and
   wherein each of the buffered interconnects comprises at least one buffer and the at least one buffer has a characteristic of reducing a signal delay as a temperature increases.

6. The ULV digital circuit of claim 5, where each of the plurality of logic gates comprises at least one of a FinFET transistor, a CMOS transistor, a MOSFET transistor, or a multi gate transistor.

7. The ULV digital circuit of claim 5, wherein the voltage controller is configured to provide a buffer voltage to the at least one buffer and control each of the driving voltage and the buffer voltage independently based on the detected temperature.

8. The ULV digital circuit of claim 5, wherein the reference signal delay is a signal delay of the logic circuit at a lowest operating temperature in an operating temperature range of the logic circuit and a highest driving voltage in a driving voltage range of the logic circuit.

9. The ULV digital circuit of claim 5, wherein the driving voltage has a ULV level of less than 1 V.

10. The ULV digital circuit of claim 5, wherein when the detected temperature is included in a first temperature range, the voltage controller is configured to adjust the driving voltage to a first voltage and when the detected temperature is in a second temperature range higher than the first temperature range, the voltage controller is configured to adjust the driving voltage to a second voltage lower than the first voltage.

11. The ULV digital circuit of claim 10, wherein each of the first temperature range and the second temperature range is classified based on a relationship of a temperature increment to signal delay of each of the plurality of logic gates and buffered interconnects.

12. The ULV digital circuit of claim 5, further comprising:
   a temperature control device configured to adjust the temperature of the logic circuit; and
   a power manager configured to control the temperature control device and the voltage controller based on the detected temperature.

13. The ULV digital circuit of claim 12, wherein the power manager selectively controls the temperature control device or the voltage controller in order to reduce the power consumption based on the detected temperature.

14. The ULV digital circuit of claim 5, wherein the logic circuit, the temperature sensor, and the voltage controller are integrated on one semiconductor chip.

* * * * *